United States Patent

Tseng et al.

Patent Number: 5,949,726
Date of Patent: Sep. 7, 1999

[54] BIAS SCHEME TO REDUCE BURN-IN TEST TIME FOR SEMICONDUCTOR MEMORY WHILE PREVENTING JUNCTION BREAKDOWN

[75] Inventors: Jiunn-Chin Tseng, Tainan; Hon Shing Lau, Hsinchu, both of Taiwan

[73] Assignee: Vanguard International Semiconductor Corporation, Hsin-Chu, Taiwan

[21] Appl. No.: 09/120,360

[22] Filed: Jul. 22, 1998

[51] Int. Cl.[6] ........................................ G11C 7/00
[52] U.S. Cl. ...................... 365/201; 365/185.27
[58] Field of Search ............. 365/201, 185.18, 365/185.27, 189.09

[56] References Cited

U.S. PATENT DOCUMENTS

| | | | |
|---|---|---|---|
| 5,119,337 | 6/1992 | Shimizu et al. | 365/201 |
| 5,349,559 | 9/1994 | Park et al. | 365/201 |
| 5,363,333 | 11/1994 | Tsujimoto | 365/201 |
| 5,452,253 | 9/1995 | Choi | 365/201 |
| 5,467,356 | 11/1995 | Choi | 371/21.1 |
| 5,657,282 | 8/1997 | Lee | 365/201 |
| 5,790,465 | 8/1998 | Roh et al. | 365/201 |

*Primary Examiner*—Son T. Dinh
*Attorney, Agent, or Firm*—George O. Saile; Stephen B. Ackerman

[57] ABSTRACT

This invention describes a biasing scheme that reduces burn-in testing time as well as the number of cycles through the burn-in test for a semiconductor memory. The magnitude of a substrate back bias is reduced when a semiconductor memory device is taken into burn-in at a first value of an external applied voltage. When the memory device is brought out of burn-in, the substrate back bias is returned to the original operating level at a second value of the external applied voltage. The reduction of the substrate back bias allows for a higher external voltage to stress the semiconductor memory without forcing breakdown and results in a shorter test time. The burn-in test is entered at a higher magnitude of the external applied voltage than the voltage at which burn-in testing is exited. This helps to reduce the number of cycles through the burn-in test by providing a stronger external bias.

17 Claims, 6 Drawing Sheets

BIAS SCHEME TO REDUCE BURN-IN TEST TIME FOR SEMICONDUCTOR MEMORY WHILE PREVENTING JUNCTION BREAKDOWN

BACKGROUND OF THE INVENTION

1. Field of Invention

This invention relates to semiconductor integrated circuit testing and in particular burn-in testing of semiconductor memory devices.

2. Description of Related Art

In recent improvements in the CMOS process, the junction and gate-oxide breakdown has become smaller as the semiconductor geometry has become smaller. Because the junction and gate-oxide breakdown voltage is smaller, the available maximum stress voltage without concern for wear-out is also smaller.

A substrate back bias voltage is used to reduce sub-threshold current and junction capacitance, to improve device isolation, to enhance latch-up immunity, and to protect circuits from voltage undershoot of the input signal. This back bias further constrains the maximum stress voltage in burn-in which lengthens the required time in burn-in testing in order to guarantee short term and long term failure rates.

In U.S. Pat. No. 5,657,282 (Lee) is discussed a semiconductor integrated circuit having a stress circuit and a stress voltage to ensure the reliability of the integrated circuit. During test, multiple stress voltages are applied to various parts of the integrated circuit to determine weak and defective circuitry. In U.S. Pat. No. 5,467,356 (Choi) a burn-in enable circuit and a burn-in test method are disclosed. A higher than normal voltage is applied to a semiconductor memory chip. This voltage is detected by a burn-in test enable circuit and causes reset operations of word lines to be disabled, allowing the stress voltage to be applied to all access transistors simultaneously, and reducing burn-in time. In U.S. Pat. No. 5,349,559 (Park et al.) a circuit is described that generates an internal voltage for a semiconductor memory during normal operations and allows an external voltage to be used during burn-in operations. In U.S. Pat. No. 5,119,337 (Shimizu et al.) the substrate voltage of a semiconductor memory device is controlled to be lowered by means of a burn-in mode detection circuit. This allows the word line drive signal to be higher than normal to apply a stress voltage on the memory cells.

The purpose of burn-in for semiconductor memory devices is to guarantee both short term and long term failure rates to meet user specifications and requirements. These requirements establishes a need to screen out process intrinsic defects such as particles, residue and latent defects and to detect process reliability items such as metal line integrity, contact electromigration, and stress migration. To carry out a sufficient burn-in test, there is a relationship between the level of stress and the time in a burn-in test. Newer devices have thinner oxides and smaller geometry resulting in lower breakdown voltages. It thus becomes important with new devices to find a means to provide a sufficient level stress in order to contain the burn-in test time.

SUMMARY OF THE INVENTION

During normal read and write operations in a semiconductor memory device, the substrate is back biased to a voltage level to reduce memory cell junction capacitance and sub-threshold leakage current. In a P-type substrate this back bias is a negative voltage, and in an N-type substrate is a positive voltage. When the external applied voltage is raised to a maximum stress level, the memory device enters into a burn-in operation mode, and the substrate back bias is adjusted to a lower magnitude to alleviate and relax the possibility of junction breakdown. This allows a higher external applied burn-in stress voltage than would otherwise be allowed which in turn allows the time in burn-in test to be controlled to an acceptable length.

The testing can be done by cycling in and out of burn-in a number of times to test at different guard band bias levels. At each guard band bias level, lowering the magnitude of the substrate back bias as the memory device is taken into burn-in and raising the magnitude of the substrate back bias as the device is brought out of burn-in. To reduce the number of burn-in cycles the magnitude of substrate back bias is reduced at an upper stress level of the external applied voltage as the device enters burn-in, and the magnitude of the back bias voltage is returned to its normal level as the device exits the burn-in test at a lower stress level of the applied external voltage. The upper stress voltage level of the external applied voltage is the magnitude of a guard band added to the magnitude of a nominal stress voltage. The lower stress level of the external applied voltage is the magnitude of a guard band subtracted from the magnitude of a nominal stress voltage. Thus, the burn-in operation has a hysteresis like effect where the semiconductor device enters burn in at an external applied voltage that is higher in magnitude than the magnitude of the external applied voltage where the device is brought out of burn-in. This reduces the number of cycles through burn-in testing by entering and exiting burn-in at the guard band voltages.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
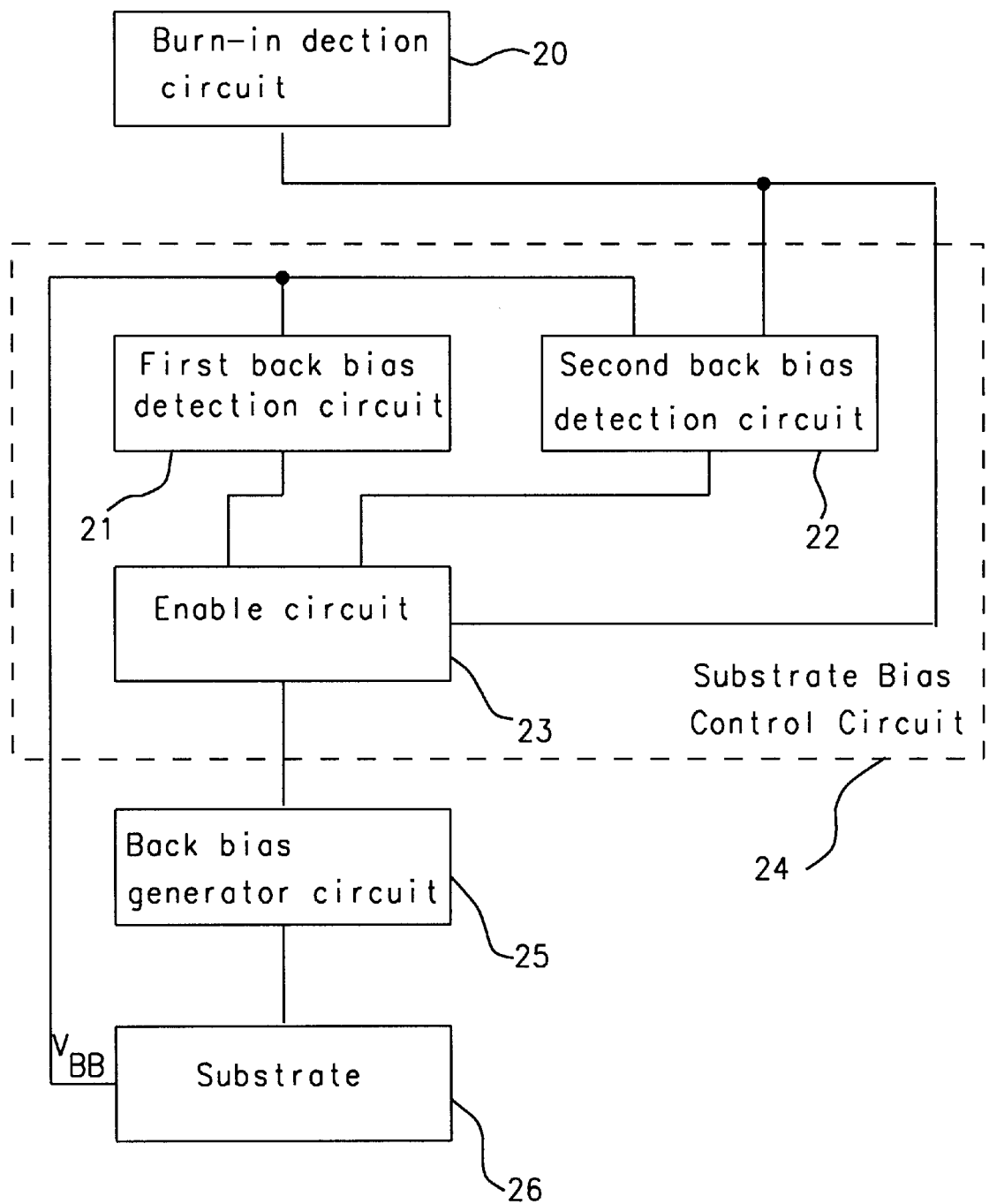
FIG. 1 is a block diagram of burn-in bias circuitry.

Shown in FIG. 1 is a block diagram of circuitry that controls substrate back bias for a semiconductor chip. A substrate bias control circuit 24 controls a substrate back bias generator circuit 25 to provide a back bias to the substrate of a semiconductor chip. There is a first back bias detection circuit 21 and a second back bias detection circuit 22 that monitors the substrate back bias V$_{BB}$ and enables the substrate back bias generator 25 to apply the appropriate magnitude of back bias V$_{BB}$ to the semiconductor substrate. The first back bias detection circuit 21 is used in normal chip operations, and the second back bias detection circuit 22 is used during burn-in testing.

Continuing to refer to FIG. 1, a burn-in detection circuit 20 monitors an external bias voltage $V_{DD}$ connected to the chip under test to determine when the chip enters burn-in. When the external bias raises to the entry voltage for burn-in, the burn-in detection circuit 20 signals the second back bias detection circuit 22 and an enable circuit 23 that burn-in testing is commencing. The enable circuit 23 selects the output of the second back bias detector 22 during burn-in testing and controls the back bias generator circuit 25 to produce a magnitude of the back bias $V_{BB}$ of the semiconductor substrate 26 that is smaller than the substrate back bias during normal chip operation. The substrate back bias $V_{BB}$ is fed back to the first and second back bias detection circuits 21 and 22. During burn-in testing the second back bias detection circuit 22 monitors the back bias $V_{BB}$, and through the enable circuit 23 controls the back bias generator 25 to produce a back bias voltage $V_{BB}$ that is smaller in magnitude than during normal chip operations. The lower back bias voltage $V_{BB}$ allows a higher external stress voltage, reduces test time and prevents breakdown during burn-in testing. During normal chip operations the first back bias detection circuit 21 monitors the back bias $V_{BB}$, and through the enable circuit 23 controls the back bias generator 25 to produce a back bias voltage $V_{BB}$ that is larger in magnitude than during burn-in testing.

Figure 2:
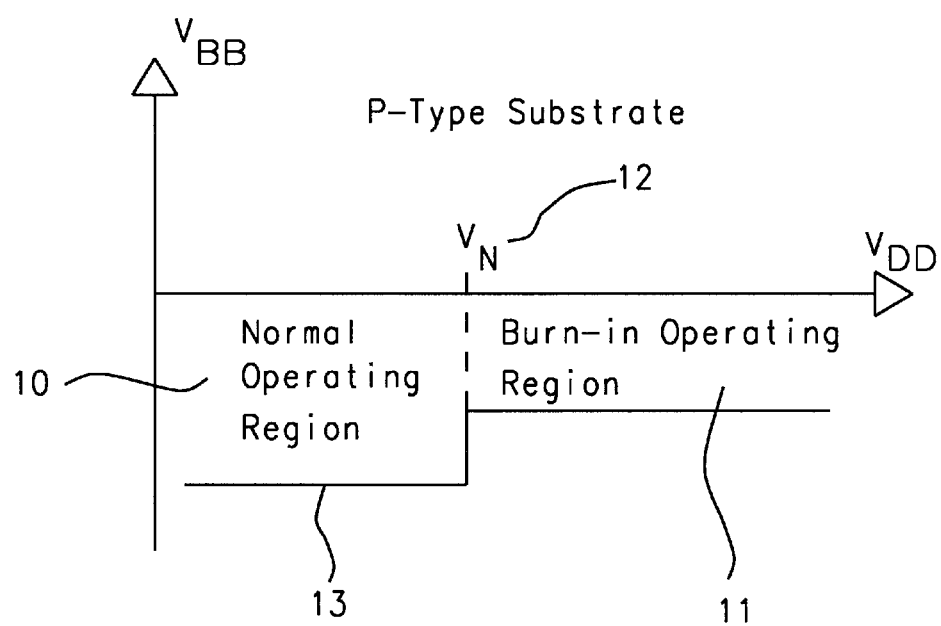
FIG. 2 is a graph of the nominal voltages involved in a burn-in test for a P-type semiconductor substrate.

In FIG. 2 is shown a graph of $V_{DD}$, an external voltage, and $V_{BB}$, a substrate back bias, for a semiconductor memory on a P-type substrate. Along the $V_{DD}$ axis there is shown a normal operating region 10 and a burn-in operating region 11 separated by a voltage level $V_N$ 12. When the external voltage, $V_{DD}$, is ramped up during burn-in, the substrate back bias 13, $V_{BB}$, is reduced to a lower magnitude at $V_N$ 12 as the semiconductor memory device is taken into the burn-in operating region 11. This keeps the burn-in voltages less than breakdown, and provides for a higher burn-in voltage and a shorter burn-in test time. At the end of burn-in testing the substrate back bias 13, $V_{BB}$, is increased to the original magnitude in the normal operating region 10 when the external bias, $V_{DD}$, reaches $V_N$ 12.

Figure 3:
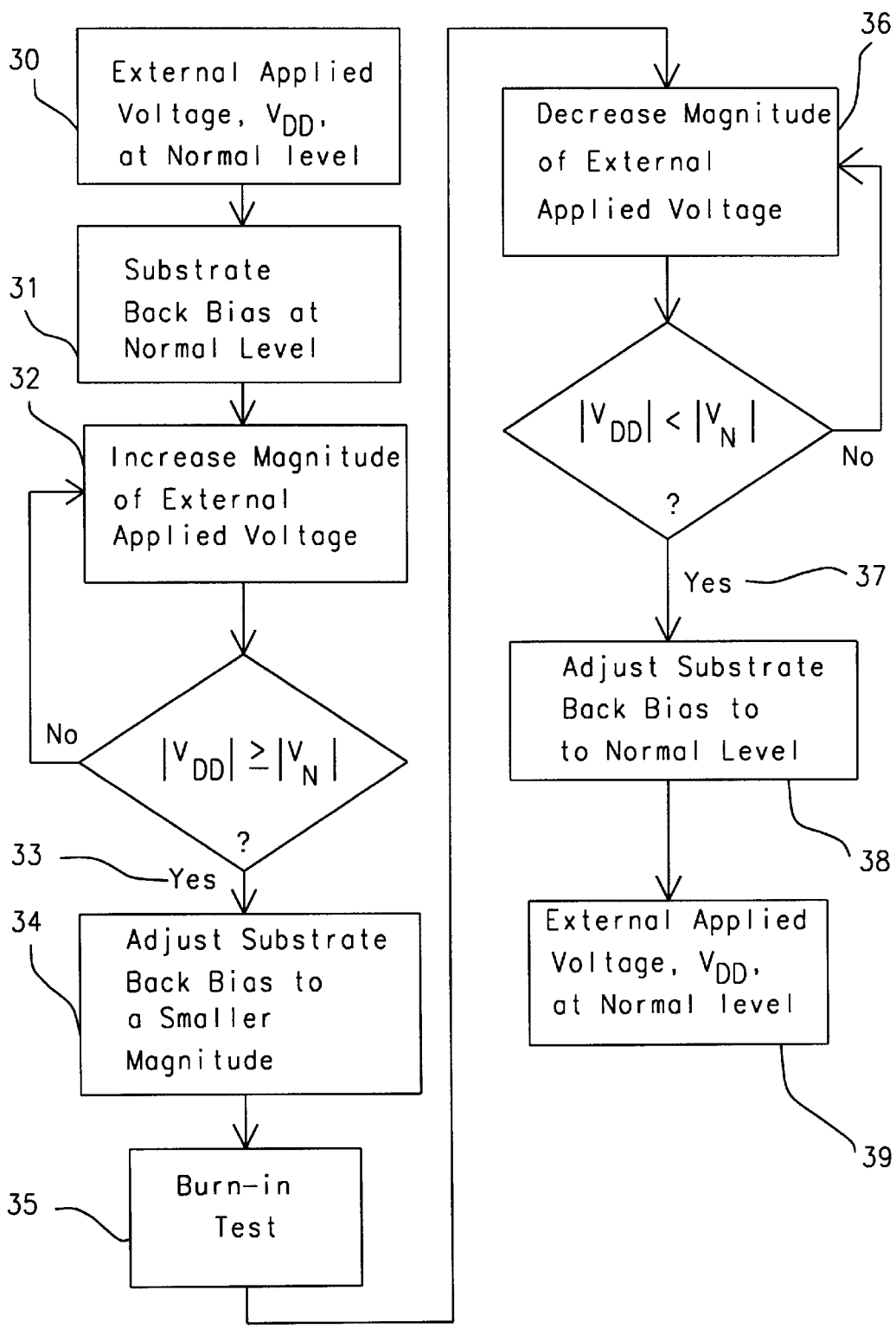
FIG. 3 is a process flow of the method of adjusting the substrate bias as a semiconductor memory enters and exits burn-in testing at a nominal voltage.

Referring to FIG. 3, a process flow is shown for a method for higher stress voltage and reduce burn-in testing time. A semiconductor memory device is connected to an external voltage, $V_{DD}$, at a normal operating level 30. A substrate back bias voltage is also at a normal operating level 31. The magnitude of the external applied voltage is increased 32 until the magnitude of the external applied voltage is equal to or greater than the magnitude of a predetermined voltage value $V_N$ 33. At the predetermined voltage value, the substrate back bias is reduced to a smaller magnitude 34. This reduced magnitude of the substrate back bias allows a larger magnitude of external voltage during burn-in, producing a higher level of stress and reducing the burn-in test time. Burn-in testing then occurs 35 and at the end of the testing the magnitude of the external applied voltage is decreased 36. When the magnitude of the external applied voltage, $V_{DD}$, is less than the magnitude of the predetermined voltage value, $V_N$ 37, then the substrate back bias is adjusted to the normal operating level 38 and the external applied voltage, $V_{DD}$, is set to the normal operating level 39 to end the test. This method is valid for semiconductor memories having either a P-type or an N-type substrate.

Figure 4:
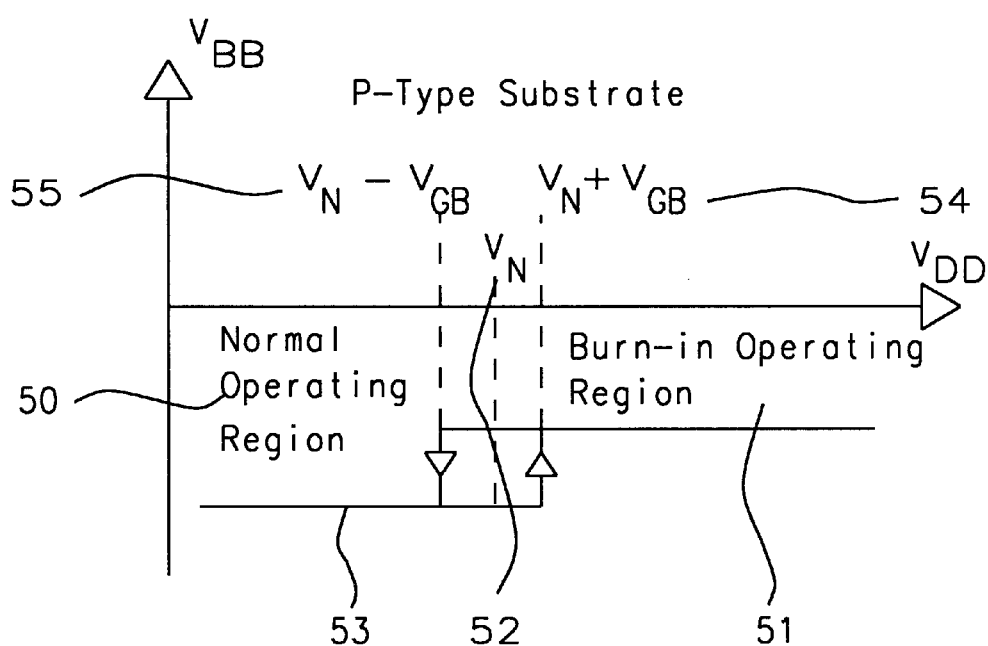
FIG. 4 is a graph showing the adjustment of a substrate back bias for a P-type semiconductor substrate entering and exiting burn-in at guard band voltages.

In FIG. 4 is shown a graph of $V_{DD}$, an external voltage, and $V_{BB}$, a substrate back bias, for a semiconductor memory on a P-type substrate. Along the $V_{DD}$ axis of the graph there is shown a normal operating region 50 and a burn-in operating region 51 separated by a voltage level $V_N$ 52 and two guard band voltages $V_N+V_{GB}$ 54 and $V_N-V_{GB}$ 55. When the external voltage, $V_{DD}$, is ramped up during burn-in, the substrate back bias 53, $V_{BB}$, is reduced to a lower magnitude at an upper guard band voltage 54, $V_N+V_{GB}$, as the semiconductor memory device is taken into the burn-in operating region 51. This keeps the range of voltages less than breakdown, providing for a higher burn-in voltage and a shorter burn-in test time. At the end of burn-in testing the substrate back bias 53, $V_{BB}$, is increased to the original magnitude in the normal operating region 50 when the external bias, $V_{DD}$, reaches the lower guard band voltage 55, $V_N-V_{GB}$. This hysteresis like effect as shown in FIG. 4 reduces the number of cycles the semiconductor memory device needs to go through burn-in.

Figure 5:
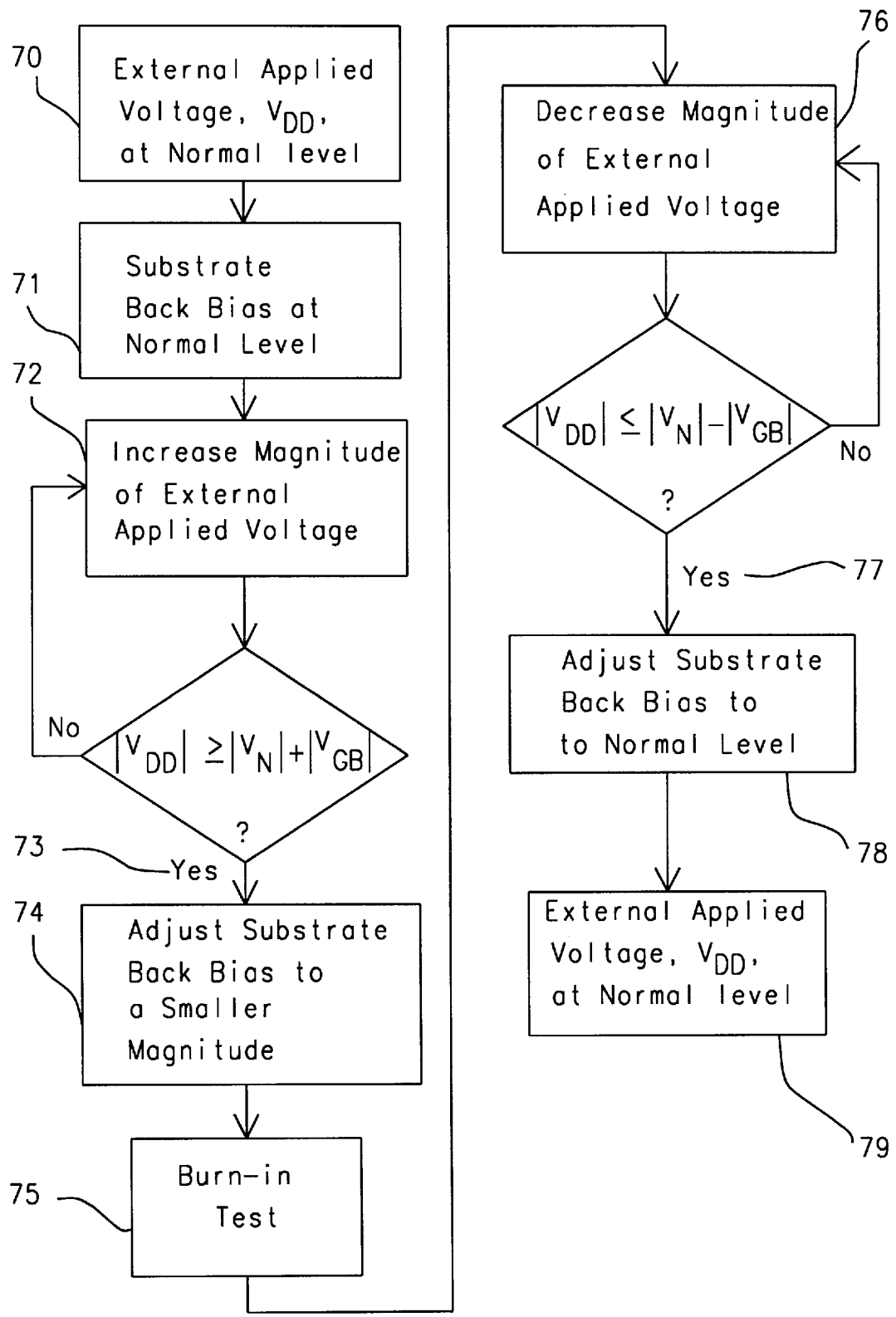
FIG. 5 is a process flow of the method of adjusting the substrate bias as a semiconductor memory enters and exits burn-in testing at guard band voltages.

Shown in FIG. 5 is a process flow for a method for higher stress voltage, reduced burn-in testing time and reduced burn-in cycling. A semiconductor memory device is connected to an external voltage, $V_{DD}$, at a normal operating level 70. A substrate back bias voltage is also at a normal operating level 71. The magnitude of the external applied voltage is increased 72 until the magnitude of the external applied voltage is equal to or greater than the sum of the magnitude of a predetermined voltage value, $V_N$, and the magnitude of a guard band voltage $V_{GB}$ 73. Then the substrate back bias is reduced to a smaller magnitude 74. This allows burn-in to take place without the semiconductor devices being pushed into breakdown and damaging the product. Burn-in testing then occurs 75 and at the end of the testing the magnitude of the external applied voltage is decreased 76. When the magnitude of the external applied voltage, $V_{DD}$, is less than the magnitude of the predetermined voltage $V_N$ minus the magnitude of a guard band voltage $V_{GB}$ 77, then the substrate back bias is adjusted back to the normal operating level 78 and the external applied voltage, $V_{DD}$, is set to the normal operating level 79 to end the test. This method is valid for semiconductor memories using either a P-type or an N-type substrate.

Figure 6:
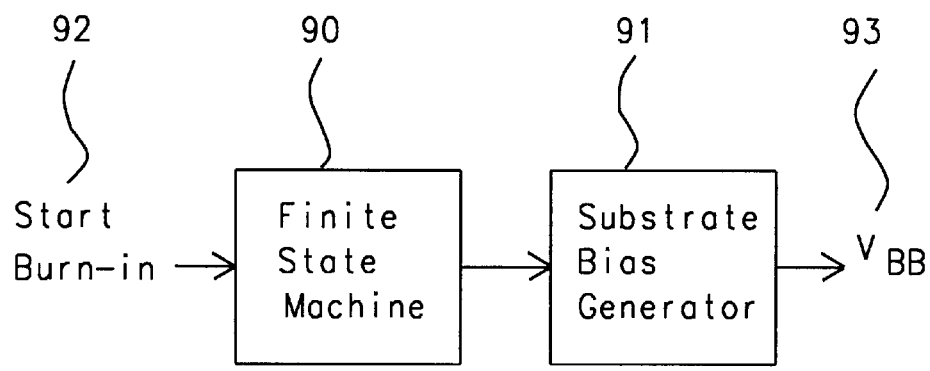
FIG. 6 is a diagram showing the use of a finite state machine for controlling the burn-in process and the substrate back bias.

In FIG. 6 is shown a setup for controlling burn-in and the entry into and out of the test. A finite state machine 90 steps the external voltage through the test upon command to start burn-in 92. When the external voltage is reaches a first predetermined voltage level, a command is given to the substrate bias generator 91 to lower the magnitude of the substrate back bias $V_{BB}$ 93. When the burn-in test is completed, the finite state machine 90 reduces the external voltage $V_{DD}$ and when a second predetermined level is reached, the finite state machine 90 gives a command to the substrate bias generator 91 to return the substrate back bias $V_{BB}$ 93 to its normal operating level. The first predetermined voltage level may be the same as the second predetermined voltage level, or the first predetermined voltage level may be at a higher magnitude than the second predetermined voltage level to help reduce the number of burn-in cycles.

While the invention has been particularly shown and described with reference to preferred embodiments thereof, it will be understood by those skilled in the art that various changes in form and details may be made without departing from the spirit and scope of the invention.

What is claimed is:

1. A method of adjusting substrate bias to prevent breakdown during burn-in and reduce testing time, comprising:
    a) testing a semiconductor memory device in burn-in,
    b) setting external applied voltage at normal operating level,
    c) setting substrate back bias at normal operating level,
    d) raising magnitude of said external applied voltage to a burn-in operating level, e) adjusting said substrate back bias to a smaller magnitude at a first voltage level of the external applied voltage, f) adjusting said substrate back bias to said nominal operating level at a second voltage level of the external voltage at end of burn-in testing.

2. The method of claim 1, wherein said first voltage level of the external applied voltage is a larger magnitude than said second voltage level of the external applied voltage to test at guard band voltage levels and reduce the number of burn-in cycles.

3. The method of claim 1, wherein both P-substrate and N-substrate devices can be burn-in tested using the appropriate voltage polarities, comprising:

a) burn-in testing a P-substrate memory device using negative substrate back bias and positive external bias, b) burn-in testing a N-substrate memory device using positive substrate back bias and negative external bias.

4. The method of claim 1, wherein the burn-in test can be recycled at different external voltage guard band levels to test additional stress levels of the semiconductor device.

5. The method of claim 1, wherein reduced substrate back bias with increased external applied bias in a semiconductor memory device allows a maximum stress voltage, reduce burn-in time and prevent junction breakdown during burn-in operation.

6. The method of claim 1, wherein adjusting substrate back bias to a lower magnitude during burn-in permits a higher stress level from said external voltage which shortens the burn-in time.

7. A method of burn-in test at guard band levels to reduce test cycling, comprising:

a) testing a semiconductor memory device in burn-in, b) setting an external voltage at a normal operating level, c) setting a substrate back bias at a normal operating level, d) raising magnitude of the external voltage to a value equal to a magnitude of a nominal burn-in voltage plus a magnitude of a guard band voltage, e) adjusting said substrate back bias to a smaller magnitude, f) continuing to raise magnitude of external voltage for burn-in test, g) reducing magnitude of said external voltage at end of burn-in to a value equal to the magnitude of said nominal burn-in voltage minus the magnitude of a guard band voltage, h) setting said substrate back bias at normal operating level, i) setting external voltage at normal operation level.

8. The method of claim 7, wherein both P-substrate and N-substrate devices can be burn-in tested using the appropriate voltage polarities, comprising:

a) burn-in testing a P-substrate memory device using negative substrate back bias and positive external bias, b) burn-in testing a N-substrate memory device using positive substrate back bias and negative external bias.

9. The method of claim 7, wherein controlling the external voltage and the substrate back bias is done with a finite state machine during the burn-in process.

10. The method of claim 7, wherein adjusting substrate back bias to a lower magnitude during burn-in permits a higher stress level from said external voltage and shortens the burn-in test time.

11. A method of voltage conditioning for burn-in testing of semiconductor memory devices to minimize testing time, comprising:

a) increasing magnitude of external voltage, b) decreasing magnitude of substrate back bias at a first predetermined level of said external voltage, c) testing said semiconductor memory devices in burn-in conditions, d) decreasing magnitude of external voltage, e) increasing magnitude of substrate back bias at a second predetermined level of said external voltage.

12. The method of claim 11, wherein said first predetermined level of the external voltage is of higher magnitude than said second predetermined level of the external voltage to reduce recycling of the burn-in test.

13. The method of claim 11, wherein both P-substrate and N-substrate devices can be burn-in tested using the appropriate voltage polarities, comprising:

a) burn-in testing a P-substrate memory device using negative substrate back bias and positive external bias, b) burn-in testing a N-substrate memory device using positive substrate back bias and negative external bias.

14. The method of claim 11, wherein decreasing magnitude of substrate back bias during burn-in permits a higher stress level from said external voltage and shortens the burn-in test time.

15. A circuit to control substrate back bias for a semiconductor chip, comprising:

a) a burn-in detection circuit to detect when an external voltage connected to a semiconductor chip is raised to a burn-in voltage level, b) a first back bias detection circuit to detect substrate back bias during normal operation of said semiconductor chip, c) said first back bias detection circuit controls a back bias generator through an enable circuit for said semiconductor chip during normal operations, d) a second back bias detection circuit to detect substrate back bias during burn-in testing, e) said second back bias detection circuit controls said back bias generator through said enable circuit for said semiconductor chip during burn-in operations, f) said burn-in detection circuit controlling said enable circuit to select output from said second back bias detection circuit, g) said enable circuit controlling said substrate back bias generator to produce a lower magnitude substrate back bias during burn-in testing than during normal operations, h) said substrate back bias fed back to second back bias detection circuit to control the magnitude of the substrate back bias.

16. The circuit of claim 15, wherein said back bias generator produces a substrate back bias for normal semiconductor chip operations that is higher in magnitude than during burn-in testing.

17. The circuit of claim 15, wherein said semiconductor substrate can be either P type or N type with an appropriate change in voltage polarity.

* * * * *